United States Patent
Horie et al.

(10) Patent No.: US 9,778,549 B2
(45) Date of Patent: Oct. 3, 2017

(54) OPTICAL ELEMENT

(71) Applicant: Panasonic Intellectual Property Management Co., Ltd., Osaka (JP)

(72) Inventors: Toshiaki Horie, Osaka (JP); Soichiro Hiraoka, Hyogo (JP); Shinsuke Nakazono, Osaka (JP); Kazuki Komaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/237,247

(22) Filed: Aug. 15, 2016

(65) Prior Publication Data
US 2016/0356984 A1   Dec. 8, 2016

Related U.S. Application Data

(63) Continuation-in-part of application No. 14/388,213, filed as application No. PCT/JP2013/002770 on Apr.
(Continued)

(30) Foreign Application Priority Data

May 7, 2012   (JP) ................. 2012-105720
Mar. 13, 2014  (JP) ................. 2014-049638

(51) Int. Cl.
*G03B 21/00*   (2006.01)
*H04N 9/31*    (2006.01)
(Continued)

(52) U.S. Cl.
CPC .............. *G03B 21/008* (2013.01); *B81B 3/00* (2013.01); *G02B 26/0858* (2013.01); *G02B 26/105* (2013.01); *H04N 9/3129* (2013.01)

(58) Field of Classification Search
CPC ....... B81B 3/00; B81B 3/0035; B81B 3/0037; B81B 3/004; B81B 3/0043; B81B 3/0045;
(Continued)

(56) References Cited

U.S. PATENT DOCUMENTS

| 4,898,035 A | 2/1990 | Yajima et al. |
| 6,556,333 B2 | 4/2003 | Tokuda et al. |

(Continued)

FOREIGN PATENT DOCUMENTS

| CN | 101221283 A | 7/2008 |
| CN | 101750734 A | 6/2010 |

(Continued)

OTHER PUBLICATIONS

Office Action issued in U.S. Appl. No. 14/898,722 dated Sep. 29, 2016.

*Primary Examiner* — Kimberly N Kakalec
(74) *Attorney, Agent, or Firm* — McDermott Will & Emery LLP

(57) ABSTRACT

An optical reflecting device includes a mirror part, a pair of joints, a pair of vibration parts, a plurality of driving parts, and a fixed part. Each of the joints has a first end connected to respective one the facing positions to each other on the mirror part and a second end opposite to the first end, and extends along a first axis. Each of the vibration parts has a central portion connected to the second end of respective one of the joints. A plurality of driving parts is disposed in each of the pair of vibration parts, and rotates the mirror part. Both ends of each of the pair of vibration parts are connected to the fixed part. The beam width defined as the length of each of the joints in a direction orthogonal to the first axis is greater than the beam width of each of the pair of vibration parts.

14 Claims, 15 Drawing Sheets

Related U.S. Application Data 24, 2013, now Pat. No. 9,523,849, application No. 15/237,247, which is a continuation-in-part of application No. 14/898,722, filed as application No. PCT/JP2015/000414 on Jan. 30, 2015.

(51) Int. Cl.
   *B81B 3/00* (2006.01)
   *G02B 26/08* (2006.01)
   *G02B 26/10* (2006.01)

(58) Field of Classification Search
   CPC ... B81B 3/0048; B81B 3/0051; B81B 3/0054; B81B 3/0056; B81B 3/0059; B81B 3/0062; B81B 3/0064; B81B 3/0067; B81B 3/007; B81B 3/0072; B81B 3/0075; B81B 3/0078; B81B 3/0097; B81B 2201/04; B81B 2201/042; B81B 2201/047; B81B 2203/0145; B81B 2203/0154; B81B 2203/0172; B81B 2203/056
   USPC ......... 359/198.1–199.4, 200.6–200.8, 202.1, 359/221.2, 223.1–225.1, 226.2, 290–295, 359/838, 846, 871, 872, 904; 250/204, 250/559.06, 559.29, 230, 234; 347/255–260; 353/38, 98–99; 385/15–18, 22; 398/12, 19, 45
   See application file for complete search history.

(56) References Cited

U.S. PATENT DOCUMENTS

| | | |
|---|---|---|
| 7,282,393 B2 | 10/2007 | Tarn |
| 7,402,878 B2 | 7/2008 | Tarn |
| 7,446,911 B2 | 11/2008 | Asai et al. |
| 7,449,773 B2 | 11/2008 | Tarn |
| 7,872,338 B2 | 1/2011 | Tarn |
| 8,803,936 B2 | 8/2014 | Adachi et al. |
| 9,056,764 B2 | 6/2015 | Tarn |
| 9,151,949 B2 | 10/2015 | Hofmann et al. |
| 2002/0017563 A1 | 2/2002 | Tokuda et al. |
| 2002/0097952 A1 | 7/2002 | Jin et al. |
| 2004/0232535 A1 | 11/2004 | Tarn |
| 2004/0238600 A1 | 12/2004 | Tarn |
| 2004/0263938 A1* | 12/2004 | Mun .............. G02B 26/0841 359/224.1 |
| 2005/0157374 A1 | 7/2005 | Tarn |
| 2005/0185248 A1 | 8/2005 | Tarn |
| 2005/0219674 A1 | 10/2005 | Asai et al. |
| 2005/0243396 A1* | 11/2005 | Fujii .............. G02B 26/0841 359/224.1 |
| 2006/0139713 A1 | 6/2006 | Yee et al. |
| 2008/0007811 A1 | 1/2008 | Lee |
| 2008/0165402 A1 | 7/2008 | Nakamura et al. |
| 2009/0072380 A1 | 3/2009 | Tarn |
| 2009/0185254 A1 | 7/2009 | Uchigaki et al. |
| 2009/0225384 A1* | 9/2009 | Eiji .............. G02B 26/0841 359/199.1 |
| 2010/0142023 A1 | 6/2010 | Kanno et al. |
| 2010/0149615 A1 | 6/2010 | Kotera et al. |
| 2012/0062971 A1* | 3/2012 | Brown ............ G02B 26/0841 359/200.6 |
| 2012/0162739 A1* | 6/2012 | Yamada .......... G02B 26/0858 359/212.1 |
| 2012/0180949 A1 | 7/2012 | Tarn |
| 2012/0251182 A1 | 10/2012 | Adachi et al. |
| 2012/0307211 A1 | 12/2012 | Hofmann et al. |

FOREIGN PATENT DOCUMENTS

| | | |
|---|---|---|
| JP | H01-182729 A | 7/1989 |
| JP | 2002-040354 A | 2/2002 |
| JP | 2004-177543 A | 6/2004 |
| JP | 2005-191313 A | 7/2005 |
| JP | 2006-184905 A | 7/2006 |
| JP | 2007-524112 A | 8/2007 |
| JP | 2008-015486 A | 1/2008 |
| JP | 2009-071209 A | 4/2009 |
| JP | 4285568 B2 | 6/2009 |
| JP | 2009-222900 A | 10/2009 |
| JP | 2010-122412 A | 6/2010 |
| JP | 2010-139977 A | 6/2010 |
| JP | 2011-151357 A | 8/2011 |
| JP | 2013-513828 A | 4/2013 |
| WO | 2004/106221 A2 | 12/2004 |
| WO | 2008/038545 A1 | 4/2008 |
| WO | 2011/082789 A1 | 7/2011 |

* cited by examiner

OPTICAL ELEMENT

RELATED APPLICATIONS

This application is Continuation-In-Part of U.S. patent application Ser. No. 14/388,213, filed Sep. 25, 2014, which is the U.S. National Phase under 35 U.S.C. §371 of International Application No. PCT/JP2013/002770, filed Apr. 24, 2013, which in turn claims the benefit of Japanese Application No. 2012-105720, filed May 7, 2012, and of U.S. patent application Ser. No. 14/898,722, filed Dec. 15, 2015, which is the U.S. National Phase under 35 U.S.C. §371 of International Application No. PCT/JP2015/000414, filed on Jan. 30, 2015, which in turn claims the benefit of Japanese Application No. 2014-049638, filed on Mar. 13, 2014, the disclosures of which are incorporated by reference herein.

BACKGROUND

1. Technical Field

The present invention relates to an optical reflecting device used in an image projection device such as a head-up display and a head-mounted display.

2. Background Art

Recently, an optical reflecting device for scanning with a laser beam and projecting an image on a screen or the like using a micro electro mechanical systems (MEMS) technology has been developed. In order to project an image, a two-dimensional scan with a laser beam needs to be performed using the optical reflecting device. As a method of driving the optical reflecting device, a piezoelectric actuator is employed, for example.

FIG. 15 is a perspective view of conventional optical reflecting device 1. Optical reflecting device 1 includes mirror part 9, fixed part 3 supporting mirror part 9, a pair of vibrating beams 4, and piezoelectric layers 10 for rotating mirror part 9. Each vibrating beam 4 couples mirror part 9 to fixed part 3 so that mirror part 9 rotates with respect to fixed part 3. When piezoelectric layers 10 are energized, they expand or contract. Due to this expansion or contraction, vibrating beams 4 are twisted to rotate mirror part 9.

Each vibrating beam 4 includes torsion bar 6 extending from mirror part 9, driving member 7, and a pair of elastic members 8. Driving member 7 is connected to the end of torsion bar 6 on the opposite side to mirror part 9. The pair of elastic members 8 are disposed closer to mirror part 9 than driving member 7, and face each other via the rotation center axis of mirror part 9. A first end of each elastic member 8 is connected to driving member 7, and a second end thereof is connected to a part of fixed part 3. The piezoelectric actuator of this application is disclosed by Japanese Patent No. 4285568, for example.

SUMMARY

The present invention provides a small-sized optical reflecting device capable of achieving a large displacement and a high-frequency drive. The optical reflecting device of the present invention includes a mirror part, a pair of joints, a pair of vibration parts, a plurality of driving parts, and a fixed part. Each of the joints has a first end connected to respective one of the facing positions to each other on the mirror part and a second end opposite to the first end, and extends along a first axis. Each of the vibration parts has a central portion connected to the second end of respective one of the joints. The plurality of driving parts is disposed in each of the pair of vibration parts, and configured to rotate the mirror part. Both ends of each of the vibration parts are connected to the fixed part. A beam width defined as the length of each of the joints in a direction orthogonal to the first axis is greater than the beam width of each of the vibration parts.

In this configuration, the stress applied to the joints can be reduced to increase the mechanical strength, so that the mirror part can be driven at a high frequency by a large rotation angle (displacement).

DETAIL DESCRIPTION OF PREFERRED EMBODIMENTS

Prior to the description of the exemplary embodiments of the present invention, problems of conventional optical reflecting device 1 are described briefly. In order to increase the resolution of a projected image, it is required that the driving frequency is increased to increase the scan rate of a light flux (light spot) while the rotation angle of mirror part 9 is kept. At this time, stress concentrates to torsion bar 6, so that torsion bar 6 needs to be extended to disperse the stress. As a result, optical reflecting device 1 is enlarged and the scan rate is decreased.

Hereinafter, the optical reflecting devices of the exemplary embodiments of the present invention will be described hereinafter with reference to the accompanying drawings.

First Exemplary Embodiment

Figure 1:
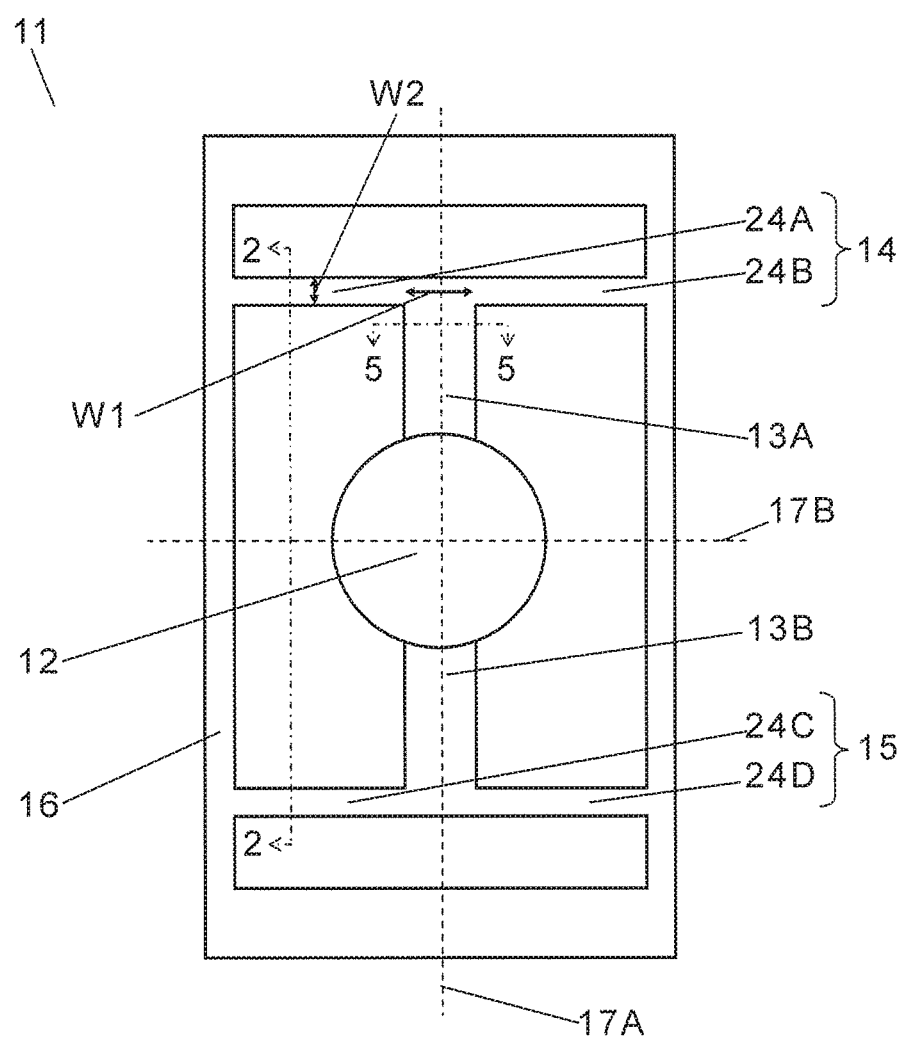
FIG. 1 is a plan view of an optical reflecting device in accordance with a first exemplary embodiment of the present invention.

FIG. 1 is a plan view of optical reflecting device 11 in accordance with a first exemplary embodiment of the present invention. In other word, optical reflecting device 11 can be expressed as "optical element 11". Optical reflecting device 11 includes mirror part 12, a pair of joints 13A and 13B, a pair of vibration parts 14 and 15, a plurality of driving parts 24A, 24B, 24C, and 24D, and fixed part 16. The joint 13A can be expressed as "first beam 13A". The joint 13B can be expressed as "second beam 13B". The driving part 24A can be expressed as "third beam 24A". The driving part 24B can be expressed as "fourth beam 24A". The driving part 24C can be expressed as "fifth beam 24C". The driving part 24D can be expressed as "sixth beam 24D". Joints 13A and 13B are extended along first axis 17A, and face each other so as to sandwich mirror part 12. In other words, a first end of joint 13A is connected to mirror part 12, and supports mirror part 12. A first end of joint 13b is connected to mirror part 12, and supports mirror part 12. The first end of joint 13A and the first end of joint 13B are disposed at facing positions to each other on the mirror part 12. In other word, the first end of joint 13A and the first end of joint 13B are disposed on the opposite sides with respect to the mirror part 12. A second end of joint 13A is connected to the vibration parts 14 (third beam 24A and fourth beam 24B). A second end of joint 13B is connected to the vibration parts 15 (fifth beam 24C and sixth beam 24D). Vibration parts 14 and 15 sandwich joints 13A and 13B at the central portions thereof, and are connected to the second ends of joints 13A and 13B. Vibration parts 14 and 15 are extended along second axis 17B orthogonal to first axis 17A. Frame-shaped fixed part 16 is connected to both ends of each of vibration parts 14 and 15, and supports vibration parts 14 and 15. Fixed part 16 may be formed of two or more components or does not need to have a frame shape as long as fixed part 16 supports vibration parts 14 and 15.

Driving parts 24A and 24B (In other word, third beam 24A and fourth beam 24B) are disposed on the opposite sides with respect to the central portion of vibration part 14, and driving parts 24C and 24D (in other word, fifth beam 24C and sixth beam 24D) are disposed on the opposite sides with respect to the central portion of vibration part 15. Driving parts 24A to 24D rotate mirror part 12 around first axis 17A serving as the center axis. Driving parts 24A to 24D have a straight shape extended in the second axis 17B direction, or a curved shape.

Figure 2:
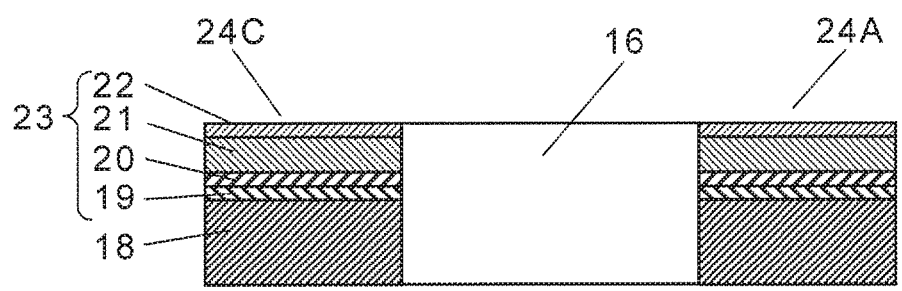
FIG. 2 is a sectional view of the optical reflecting device taken along t line 2-2 shown in FIG. 1.

Next, the configurations of driving parts 24A to 24D are described with reference to FIG. 2. FIG. 2 is a sectional view taken along the line 2-2 shown in FIG. 1. Driving parts 24A and 24C forming vibration parts 14 and 15 have, as the lowest layer, silicon substrate 18 formed integrally over whole optical reflecting device 11, and have insulating film 19 on silicon substrate 18. Lower electrode film 20 is disposed on insulating film 19, piezoelectric film 21 is disposed on lower electrode film 20, and upper electrode film 22 is disposed on piezoelectric film 21. Thus, piezoelectric layer 23 is formed of insulating film 19, lower electrode film 20, piezoelectric film 21, and upper electrode film 22.

Lower electrode film 20 and upper electrode film 22 are formed of a metal film such as platinum, gold, titanium, and tungsten, and piezoelectric film 21 is made of a piezoelectric material such as lead zirconate titanate ($Pb(Zr_{1-x}Ti_x)O_3$). They can be produced as a thin film by vapor deposition, sol-gel method, CVD (chemical vapor deposition), spatter method, or the like. Driving parts 24B and 24D are configured similarly. In other words, driving parts 24A to 24D are produced by sequentially stacking lower electrode film 20, piezoelectric film 21, and upper electrode film 22.

When a predetermined voltage is applied between lower electrode film 20 and upper electrode film 22, piezoelectric film 21 expands or contracts in the plane direction of piezoelectric film 21 due to an inverse piezoelectric effect. Therefore, driving parts 24A to 24D each including piezoelectric film 21 are bent in the thickness direction.

When the phase of the voltage applied to driving part 24A is set opposite to that of the voltage applied to driving part 24B, driving parts 24A and 24B are bent in the opposite directions. Here, driving part 24B is disposed on the opposite side of joint 13A with respect to driving part 24A. As a result, joint 13A sandwiched between driving parts 24A and 24B is twisted.

Similarly to joint 13A, joint 13B is twisted when voltages of opposite phases are applied to driving parts 24C and 24D. When the voltages applied to driving parts 24A and 24C are set to have the same phase and the voltages applied to driving parts 24B and 24D are set to have the same phase, joints 13A and 13B are twisted in the same phase. As a result, mirror part 12 rotates around first axis 17A.

When natural vibration mode of causing a rotation operation around first axis 17A is used, mirror part 12 can be displaced significantly. Therefore, when a driving frequency synchronous with the resonance frequency is applied to driving parts 24A to 24D, mirror part 12 can be significantly displaced around first axis 17A as the center axis.

When mirror part 12 is displaced, joints 13A and 13B are twisted to generate the torsional stress. As the displacement of mirror part 12 increases, the torsional stress applied to joints 13A and 13B also increases. When the torsional stress exceeds the mechanical strength of joints 13A and 13B, a crack or the like occurs in joints 13A and 13B, and mirror part 12 cannot be displaced.

Generally, in order to increase the displacement of mirror part 12, the length of joints 13A and 13B is elongated in the direction along first axis 17A and the torsional stress applied to joints 13A and 13B is reduced. When joints 13A and 13B are extended along the first axis 17A, however, optical reflecting device 11 becomes large, and the resonance frequency as the scan rate decreases as discussed above.

While, in optical reflecting device 11, beam width W1 of joints 13A and 13B is greater than beam width W2 of vibration parts 14 and 15. Beam width W1 is defined as the length of joints 13A and 13B in the direction orthogonal to first axis 17A. While, beam width W2 is defined as the length of vibration parts 14 and 15 in the direction along first axis 17A.

Due to this size relation, in joints 13A and 13B, the bending by driving parts 24A to 24D is more dominant than the twist. In other words, the bending stress applied to the whole of each of joints 13A and 13B is more dominant than the torsional stress applied to the central portions of joints 13A and 13B. The stress is thus dispersed to the whole of joints 13A and 13B, so that the displacement of mirror part 12 can be kept while the stress does not exceed the mechanical strength of the material of joints 13A and 13B.

Increasing the beam width of joints 13A and 13B allows the total mass of mirror part 12 as a rotator and joints 13A and 13B to be increased. As a result, the resonance frequency of vertical vibration mode of mirror part 12 is decreased. While, the distance from the end of each of joints 13A and 13B parallel to first axis 17A to each end of mirror part 12 in the direction along second axis 17B becomes relatively short. Therefore, the moment of inertia of mirror part 12 around first axis 17A becomes relatively small. As a result, the resonance frequency of the vibration mode of rotating mirror part 12 around first axis 17A is increased. By adjusting the balance between the total mass and distance, the resonance frequency of the vibration mode can be increased.

Figure 3:
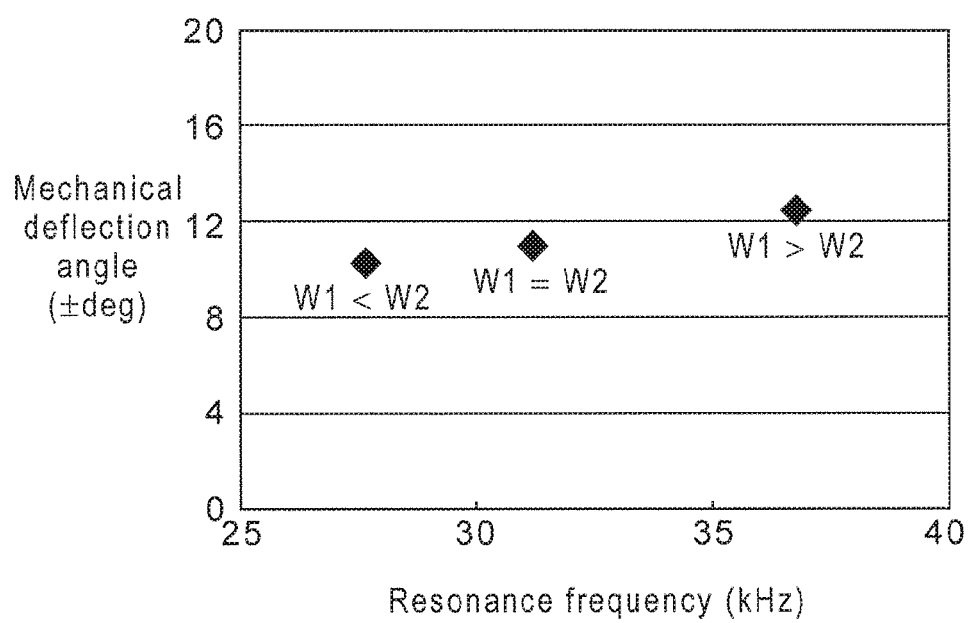
FIG. 3 is a diagram showing the relationship between the resonance frequency and mechanical deflection angle of the optical reflecting device shown in FIG. 1.

FIG. 3 shows the relationship between the resonance frequency and the mechanical deflection angle of mirror part 12 when beam width W1 of joints 13A and 13b is varied with respect to beam width W2 of vibration parts 14 and 15. The horizontal axis shows the resonance frequency, and the vertical axis shows the mechanical deflection angle. When beam width W1 of joints 13A and 13B is smaller than beam width W2 (170 μm) of vibration parts 14 and 15 by 50 μm, the resonance frequency and the mechanical deflection angle are decreased. On the other hand, when beam width W1 of joints 13A and 13B is greater than beam width W2 (170 μm) of vibration parts 14 and 15 by 100 μm, both of the resonance frequency and the mechanical deflection angle are increased and the trade-off relation can be avoided. Thus, by making beam width W1 of joints 13A and 13B greater than beam width W2 of vibration parts 14 and 15, the resonance frequency and the mechanical deflection angle can be increased simultaneously.

Figure 4:
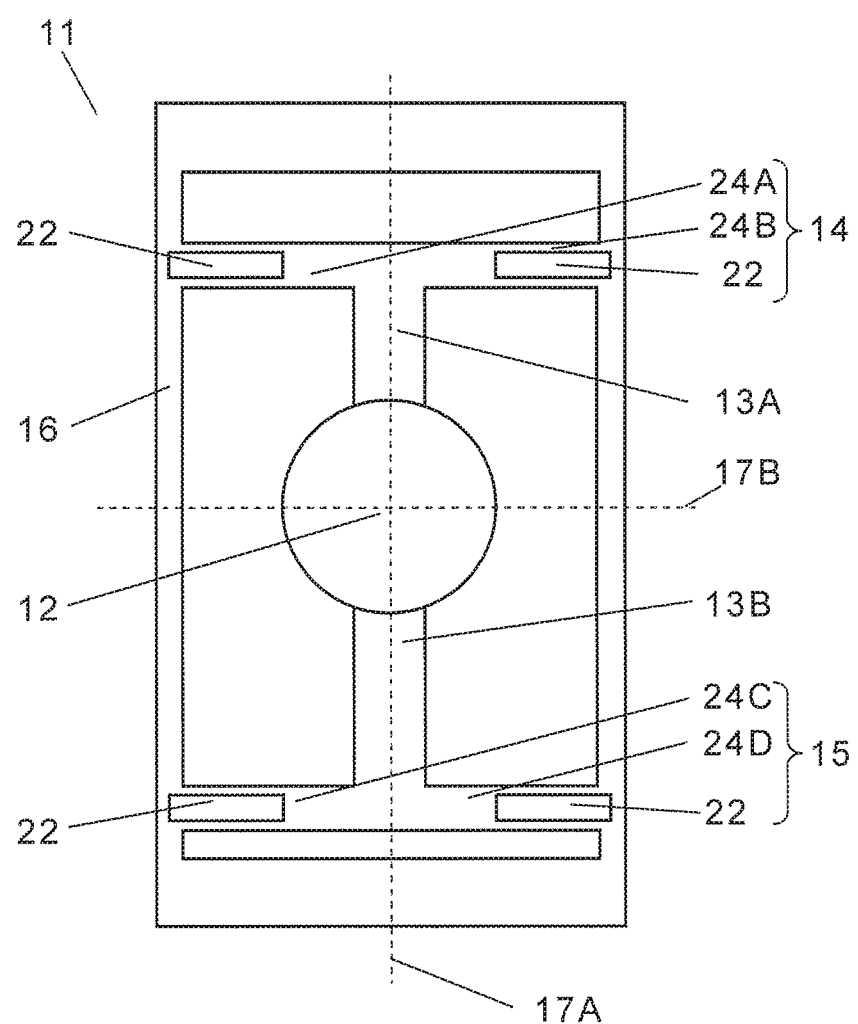
FIG. 4 is a layout drawing of electrode films in the optical reflecting device shown in FIG. 1.

Next, a preferable configuration of optical reflecting device 11 is described with reference to FIG. 4. FIG. 4 is a layout drawing of upper electrode films 22 in optical reflecting device 11.

As discussed above, each of driving parts 24A to 24D is provided with piezoelectric layer 23 for bending vibration parts 14 and 15. Therefore, piezoelectric layers 23 may simultaneously have a function of monitoring the driven states of vibration parts 14 and 15. In other words, piezoelectric film 21 has a piezoelectric effect, and hence generates a charge in response to the bending of each of driving parts 24A to 24D. The charge amount corresponding to the amount of bending is generated, so that, by monitoring the charge, the driven states of vibration parts 14 and 15 can be monitored accurately.

For this purpose, it is required that the driven states of vibration parts 14 and 15 are detected without disturbing the driving of them and the electrode film is disposed at a position at which distortion is apt to occur in piezoelectric film 21. Driving parts 24A to 24D bend, so that distortion is apt to be concentrated around fixed part 16. Therefore, as shown in FIG. 4, it is preferable that upper electrode film 22 be disposed on at least each of the boundary lines between fixed part 16 and each of vibration parts 14 and 15. In other words, it is preferable that upper electrode film 22 defining a monitor part be formed in each of the boundaries between fixed part 16 and each of vibration parts 14 and 15.

Figure 5:
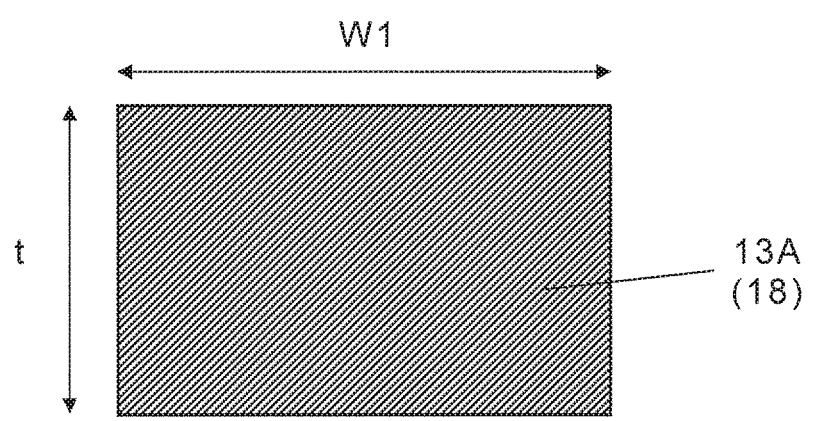
FIG. 5 is a sectional view of the optical reflecting device taken along the line 5-5 shown in FIG. 1.

Another preferable configuration of optical reflecting device 11 is described with reference to FIG. 5. FIG. 5 is a sectional view of the optical reflecting device taken along the line 5-5 shown in FIG. 1, and shows the cross section of joint 13A.

As shown, it is preferable that beam width W1 of each of joints 13A and 13B is greater than beam thickness t of each of joints 13A and 13B. Beam thickness t is defined as the length of each of joints 13A and 13B in the direction orthogonal to the plane formed of first axis 17A and second axis 17B. When beam width W1 is equal to or smaller than beam thickness t in joints 13A and 13B, the torsional stress applied to joints 13A and 13B is apt to be concentrated in side walls of joints 13A and 13B, and the effect of dispersing the stress in the plane direction by extending beam width W1 cannot be produced. When silicon substrate 18 is employed, a Bosch process is often used for processing silicon. When the Bosch process is used, however, an uneven shape called scallop occurs in the side walls. When the stress is concentrated in the uneven part, the mechanical strength is lowered. Thus, it is preferable that beam width W1 is greater than beam thickness t in joints 13A and 13B.

Second Exemplary Embodiment

Figure 6:
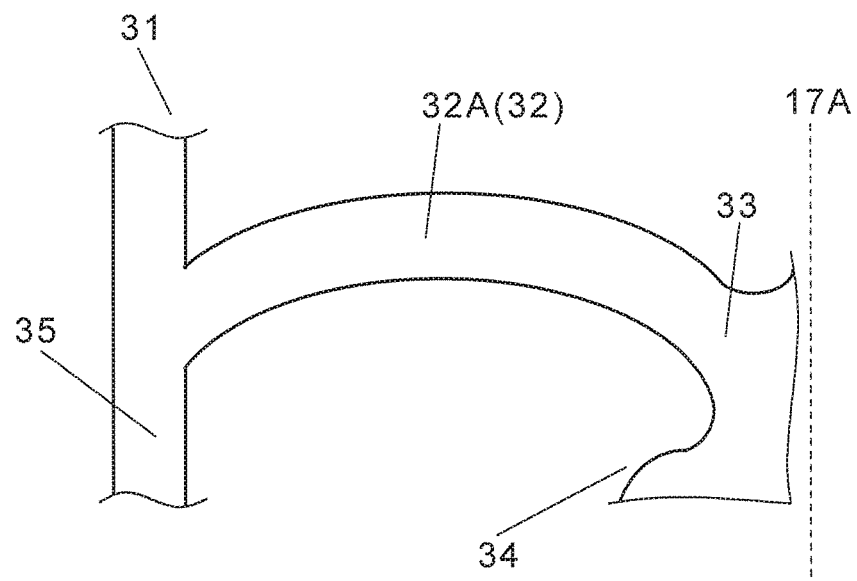
FIG. 6 is a partially enlarged view showing a vibration part of an optical reflecting device in accordance with a second exemplary embodiment of the present invention.

FIG. 6 is a partially enlarged view showing vibration part 32 of optical reflecting device 31 in accordance with a second exemplary embodiment of the present invention. Optical reflecting device 31 includes mirror part 34, joints 33, vibration parts 32, and fixed part 35. Optical reflecting device 31 is different from optical reflecting device 11 of the first exemplary embodiment in that vibration parts 32 have a curvature. The basic configuration except this point is similar to that of optical reflecting device 11. In other words, a pair of joints 33 is disposed at the facing positions on mirror part 34 (not shown). One of the joints 33 can be expressed as "first beam 331". The other one of the joints 33 can be expressed as "second beam (not shown)".

A pair of vibration parts 32 is disposed, and respective central portions of vibration parts 32 are connected to joints 33 (not shown).

Both ends of each of vibration parts 32 are connected to fixed part 35. The beam width defined as the length of joints 33 in the direction orthogonal to first axis 17A is greater than the beam width of vibration parts 32.

Each of vibration parts 32 includes a pair of beam parts 32A between the central portion connected to joints 33 and fixed part 35, and beam parts 32A have a curved shape. In other word, one of the vibration parts 32, which is connected to the first beam 331, includes a first pair of beam parts 32A. The first pair of beam parts includes "third beam 32A" and "fourth beam (not shown)". The other one of the vibration parts 32, which is connected to the second beam (not shown), includes a second pair of beam parts 32A. The second pair of beam parts 32A includes "fifth beam (not shown)" and "sixth beam (not shown)". The beam width of each vibration part 32 is defined as the length between the outer circumference and inner circumference of the curved shape of each beam part 32A.

Each of vibration parts 32 is provided with a driving part (not shown) having a piezoelectric film thereon. When voltage is applied to the piezoelectric film, the piezoelectric film expands or contracts in the plane direction of the piezoelectric film due to an inverse piezoelectric effect, and vibration parts 32 bend in the thickness direction. The bending of each vibration part 32 causes a bending stress near the connection portion between each joint 33 and each vibration part 32. However, beam parts 32A of each vibration part 32 have a curved shape, and hence the stress near the connection portion between each joint 33 and each vibration part 32 can be dispersed. As a result, the mechanical strength is increased, and the deflection angle of mirror part 34 can be increased.

Figure 7A:
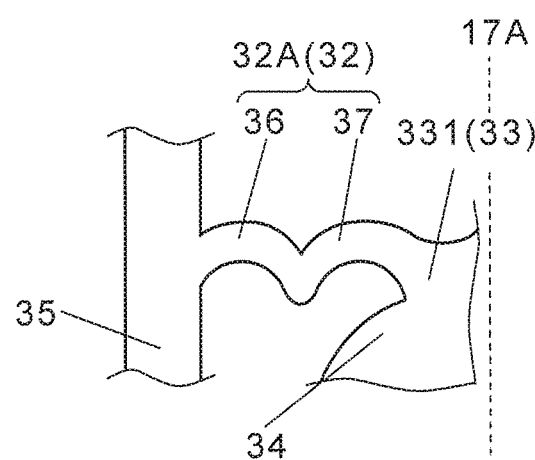
FIG. 7A is a partially enlarged view showing another vibration part of an optical reflecting device in accordance with the second exemplary embodiment of the present invention.
Figure 7B:
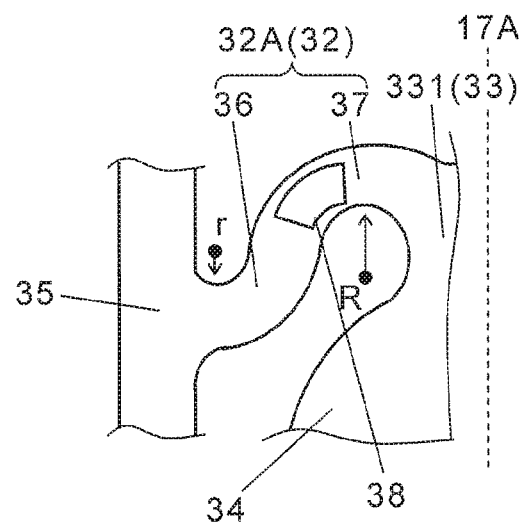
FIG. 7B is a partially enlarged view showing yet another vibration part of an optical reflecting device in accordance with the second exemplary embodiment of the present invention.
Figure 7C:
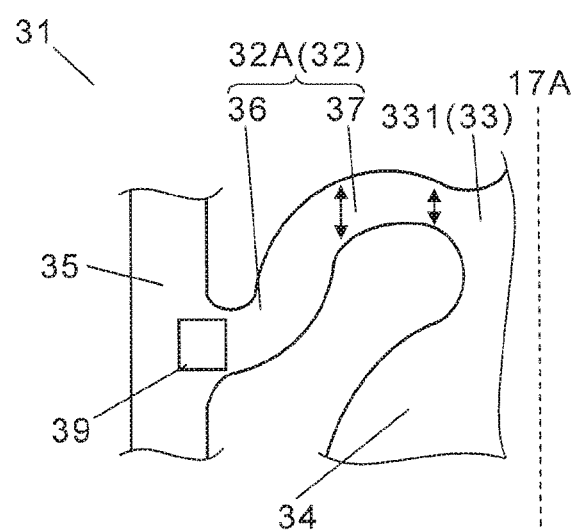
FIG. 7C is a partially enlarged view showing still another vibration part of an optical reflecting device in accordance with the second exemplary embodiment of the present invention.

Next, beam part 32A having a curved shape different from that of FIG. 6 is described with reference to FIGS. 7A to 7C. FIGS. 7A to 7C are partially enlarged views showing other vibration part 32 of the present exemplary embodiment.

In vibration part 32 of each of FIGS. 7A to 7C, beam part 32A includes first curved part 36 closer to fixed part 35, and second curved part 37 closer to the central portion connected to joint 33.

Regarding vibration parts 14 and 15 having a straight shape in the first exemplary embodiment, stress caused by bending of vibration parts 14 and 15 is apt to be concentrated in the connection portions between vibration part 14 or 15 and fixed part 16. On the other hand, first curved part 36 as the connection portion between vibration part 32 and fixed part 35 has a shape having a certain curvature radius as shown in FIGS. 7A to 7C. Therefore, the stress can be dispersed in the connection portion between fixed part 35 and first curved part 36.

Further, as shown in FIG. 7B, the curvature radius of first curved part 36 may be different from that of second curved part 37. Here, the curvature radius of first curved part 36 is denoted with r, and the curvature radius of second curved part 37 is denoted with R. In other word, a (first) curvature radius of a circumference at a connection portion between the third beam part 32A and the fixed part 35 is smaller than a (second) curvature radius of a circumference at a connection portion between the third beam part 32A and the first beam part 331. Here, the second circumference can be expressed as a circumference closer to the mirror part 34, and the first circumference is a circumference opposite to the second circumference.

In order to efficiently cause significant twist in joint 33, it is effective that the amount of the component of the driving part that is orthogonal to joint 33 is increased in the portion nearest to joint 33. In other words, when curvature radius r of first curved part 36 is equal to or larger than curvature radius R of second curved part 37, much of the orthogonal component of the driving part to joint 33 is formed on first curved part 36 apart from joint 33. Therefore, the driving efficiency of causing the twist of joint 33 is decreased.

Therefore, in order that much of the orthogonal component of the driving part to joint 33 is formed on second curved part 37 closer to joint 33, it is preferable that curvature radius r of first curved part 36 be set smaller than curvature radius R of second curved part 37. The magnitude relationship between the curvature radii of first curved part 36 and second curved part 37 can be applied also to vibration part 32 of FIG. 7A.

Piezoelectric body layer 23 (FIG. 2) forming driving part 38 is more preferably disposed on at least second curved part 37 than on first curved part 36. This arrangement enables the twist of joint 33 to be increased efficiently.

When curvature radius r of first curved part 36 is large, the optical reflecting device is extended in the first axis 17A direction with increase in curvature radius r. Therefore, as shown in FIG. 7B, it is preferable that first curved part 36 be set to have a shape that projects toward mirror part 34 along first axis 17A, and second curved part 37 be set to have a shape that projects toward fixed part 35 along first axis 17A. In other words, it is preferable that the curved directions of first curved part 36 and second curved part 37 are different from each other, and first curved part 36 and second curved part 37 project in the opposite directions. Thanks to this shape, the connection position to fixed part 35 can be set at a position close to mirror part 34. Therefore, optical reflecting device 31 can be downsized by the width corresponding to curvature radius r of first curved part 36 while stress is dispersed in the connection portion between fixed part 35 and first curved, part 36.

Furthermore, as shown in FIG. 7C, the curvature radius of second curved part 37 may be different between a portion closer to first curved part 36 and a portion closer to joint 33. Therefore, as shown in FIG. 7C, a beam width, defined as a length between an outer circumference and an inner circumference of the second curved part 37, can be different between a portion closer to the fixed part 35 from a portion closer to the first beam part 331. Here, the inner circumference can be expressed as a circumference closer to the mirror part 34, and the outer circumference is a circumference opposite to the inner circumference. The bending of vibration part 32 causes a bending stress near the connection portion between joint 33 and vibration part 32. In order to disperse this stress, the curvature radius near the connection portion needs to be increased. The stress applied to the portion of second curved part 37 that is closer to first curved part 36 is relatively small. Therefore, when the curvature radius of second curved part 37 is constant, optical reflecting device 31 is enlarged. When the curvature radius of second curved part 37 on the portion closer to first curved part 36 is set smaller than that on the portion closer to joint 33, optical reflecting device 31 can be downsized while the mechanical strength thereof is maintained.

Piezoelectric film 39 different from a film used for driving may be disposed on first curved part 36, and may also have a function of monitoring the driven state of vibration part 32 simultaneously. Piezoelectric film 39 functions as a monitor part formed in the boundary between fixed part 35 and vibration part 32.

Piezoelectric film 39 has a piezoelectric effect, so that it generates a charge in response to the bending of vibration part 32. As the generated charge amount corresponds to the amount of bending, the driven state of vibration part 32 can be monitored accurately by monitoring the charge. For this purpose, it is required that piezoelectric film 39 is disposed at a position where the driven state of vibration part 32 is detected without disturbing the driving of it and distortion is apt to occur. As vibration part 32 bends, distortion is concentrated around the boundary line between fixed part 35 and first curved part 36. Therefore, it is preferable that piezoelectric film 39 is disposed on at least the boundary line between fixed part 35 and first curved part 36.

Third Exemplary Embodiment

Figure 8:
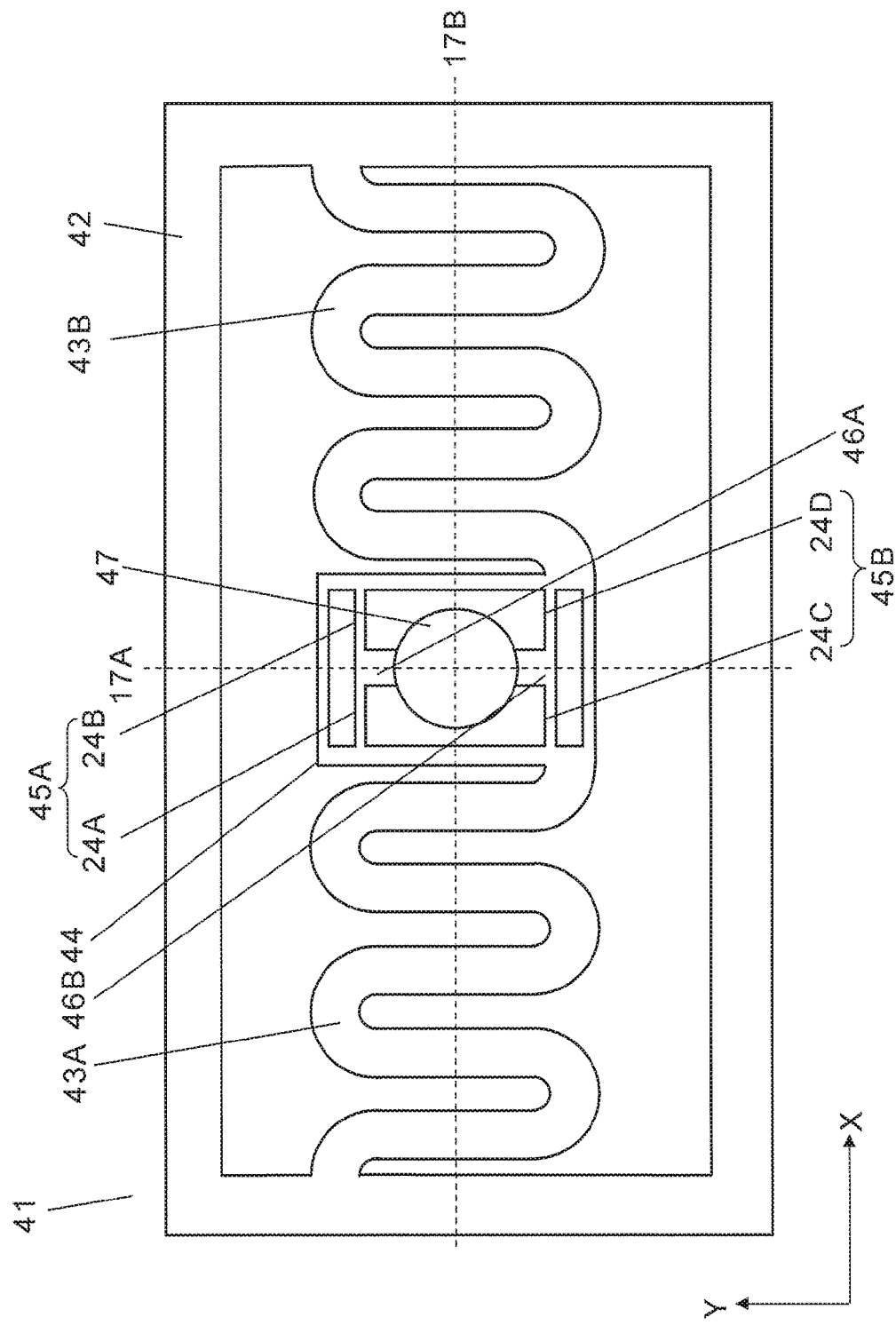
FIG. 8 is a plan view of an optical reflecting device in accordance with a third exemplary embodiment of the present invention.

FIG. 8 is a plan view of optical reflecting device 41 in accordance with a third exemplary embodiment of the present invention. Optical reflecting device 41 includes fixed part 42, a pair of first vibration parts 43A and 43B, movable frame 44, a pair of second vibration parts 45A and 45B, a pair of joints 46A and 46B, and mirror part 47.

The first ends of first vibration parts 43A and 43B are connected to the inside of fixed part 42 so that they face each other, and the second ends thereof are connected to movable frame 44. In other words, first vibration parts 43A and 43B support movable frame 44. Second vibration parts 45A and 45B are connected to both inner sides of movable frame 44, respectively. The inner sides face each other along second axis 17B. First ends of joints 46A and 46B are connected to facing positions on rotatable mirror part 47, and second ends opposite to the first ends are connected to central portions of second vibration parts 45A and 45B, respectively. First vibration parts 43A and 43B rotate movable frame 44 around second axis 17B, and second vibration parts 45A and 45B rotate mirror part 47 around first axis 17A orthogonal to second axis 17B.

Similarly to first and second exemplary embodiments referring FIG. 2, each of first vibration parts 43A and 43B has silicon substrate 18 integrally formed as the lowest layer, and insulating film 19 is formed on silicon substrate 18. Lower electrode film 20 is disposed on insulating film 19, piezoelectric film 21 is disposed on lower electrode film 20, and upper electrode film 22 is disposed on piezoelectric film 21. Lower electrode film 20, piezoelectric film 21, and upper electrode film 22 serve as a driving part.

Figure 9:
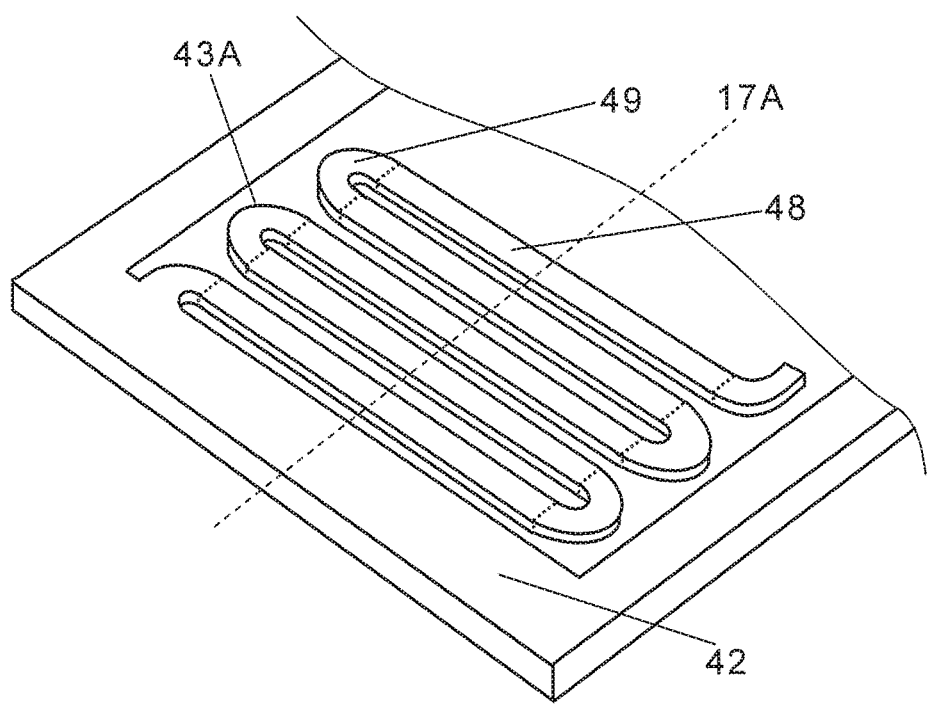
FIG. 9 is an enlarged view showing a vibration part of the optical reflecting device shown in FIG. 8.

FIG. 9 is a partially enlarged view of first vibration part 43. First vibration part 43A includes a plurality of adjacent coupling portions 48 disposed in parallel, and turning portions 49 connecting two of coupling portions 48. First vibration part 43A is formed in a meandering shape using the plurality of coupling portions 48 and the plurality of turning portions 49. When a predetermined voltage is applied between lower electrode film 20 and upper electrode film 22 of first vibration part 43A, a predetermined electric field is applied to piezoelectric film 21, and piezoelectric film 21 expands or contracts in the plane direction of piezoelectric film 21 due to an inverse piezoelectric effect. At this time, the expansion and contraction operation in the plane direction occurring in piezoelectric film 21 serves as a moment in the thickness direction of first vibration part 43A, and hence first vibration part 43A deflection-vibrates in the thickness direction. At this time, by applying voltages of opposite phases to adjacent coupling portions 48 among coupling portions 48 of first vibration part 43A, the deflections of coupling portions 48 are summed, and movable frame 44 rotates around second axis 17B.

By employing vibration parts 14 and 15 described in the first exemplary embodiment or vibration parts 32 described in the second exemplary embodiment as second vibration parts 45A and 45B, mirror part 47 can rotate by a large displacement simultaneously around first axis 17A and second axis 17B. Therefore, a laser beam or the like is radiated to mirror part 47, and a clear image or the like can be projected on a two-dimensional plane.

Fourth Exemplary Embodiment

Figure 10:
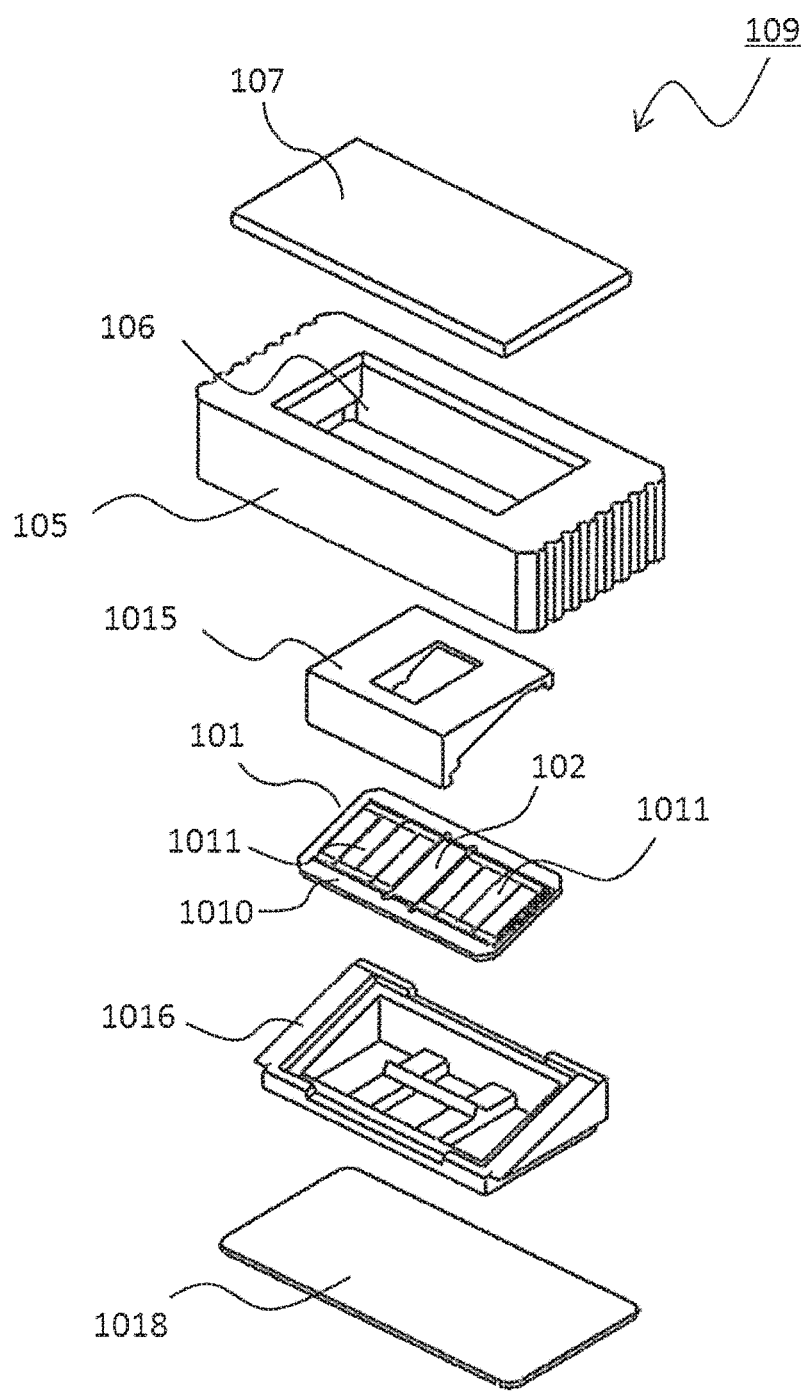
FIG. 10 is an exploded perspective view of an optical device in an embodiment according to the present disclosure.
Figure 11:
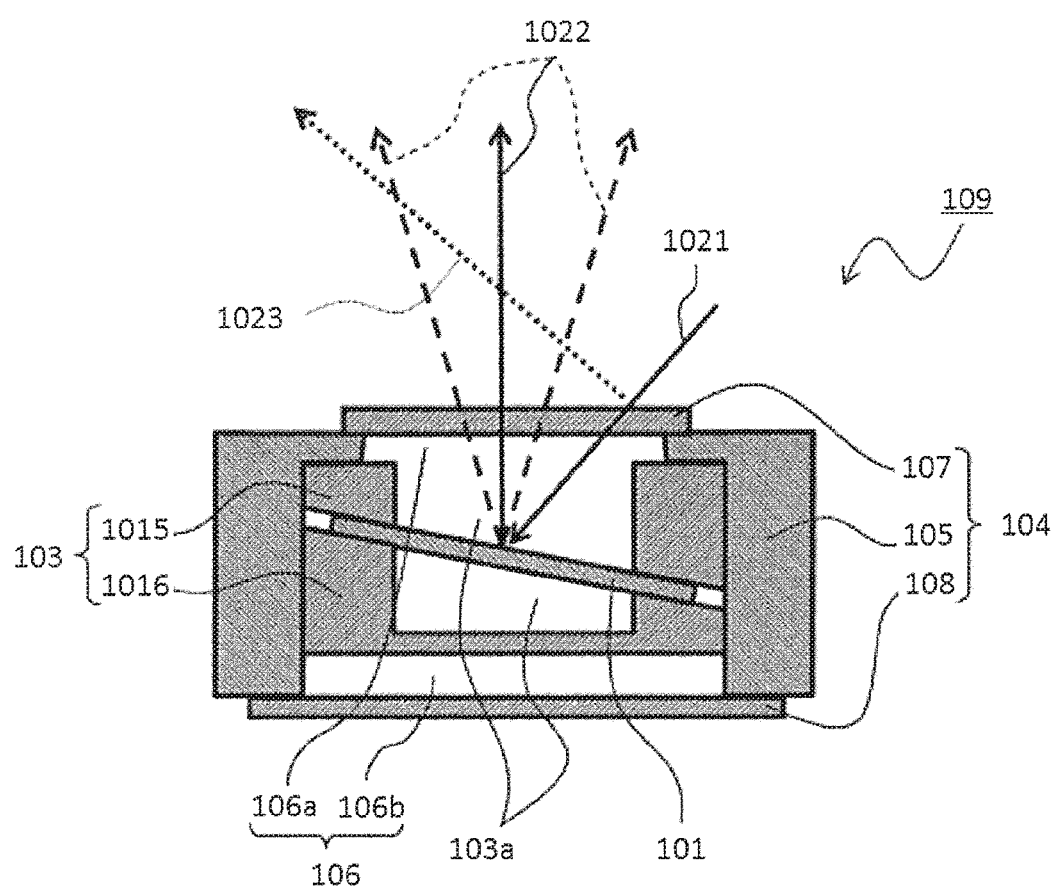
FIG. 11 is a schematic view of a usage state of the optical device according to the present disclosure.

FIG. 10 illustrates optical scanning device 109 as an example of an optical device. FIG. 11 is a schematic view of the usage state of optical scanning device 109. Optical scanning device 109 includes optical element 101 having a reflective surface in the interior of package 104. In other word, this reflective surface of the optical element 101 can be expressed as optically functional surface 102 or mirror part 102. Optical scanning device 109 controls the pivot motion of the reflective surface of optical element 101 to control the reflection angle of incoming light 1021 entering optical scanning device 109, thereby scanning outgoing light 1022 over a predetermined area. Package 104 includes window 107, wall 105, and bottom plate 108.

It is to be noted that optical element 101 is placed in package 104 with base 103 disposed therebetween. This allows optical element 101 to be pivotable.

Figure 12:
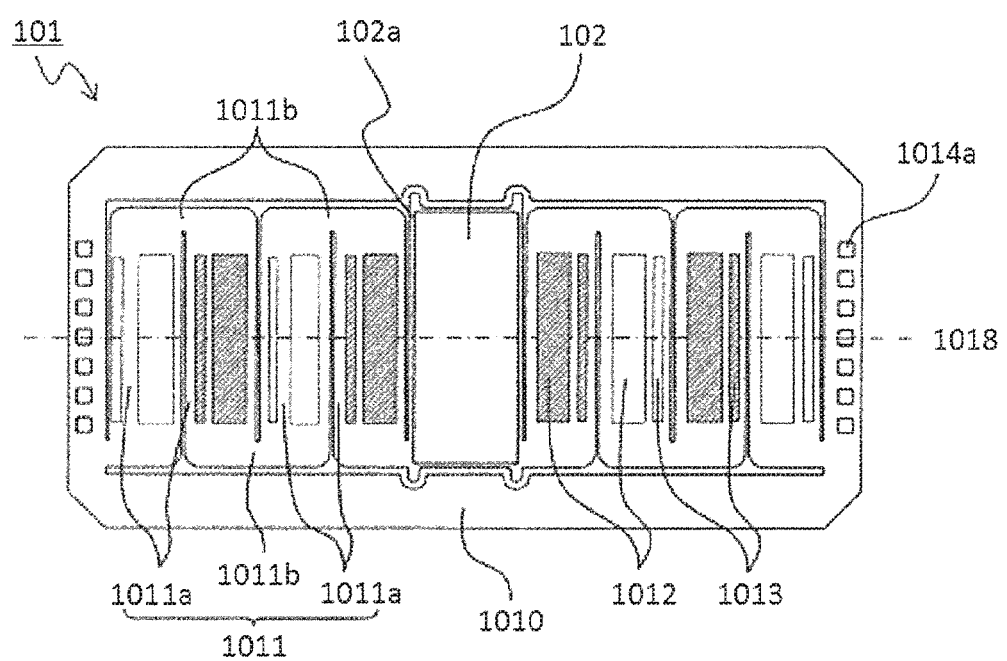
FIG. 12 is a top view of an optical element in the optical device according to the present disclosure.

Next, the structure of optical element 101 is described with reference to FIG. 12. Optical element 101 includes: movable plate 102a having optically functional surface 102; a pair of vibration beams 1011 longitudinally disposed along pivot axis 18 of movable plate 102a; and frame-like fixed portion 1010 supporting movable plate 102a with the pair of vibration beams 1011 disposed there between.

In other words, vibration beam 1011 has a first end supported by fixed portion 1010 and a second end connected to movable plate 102a having optically functional surface 102. Optically functional surface 102 is a reflective surface, for example. Vibration beam 1011 has a meandering structure in which plural sets of straight portions 1011a and folded portions 1011b are connected. Each of straight portions 1011a is provided with driver 1012 for flexurally vibrating straight portion 1011a up and down.

It is to be noted that driver 1012 is, for example, a layered structure including an upper electrode, a lower electrode, and a piezoelectric layer disposed therebetween (not shown). Driver 1012 can flexurally vibrate straight portion 1011a up and down by applying a control voltage between the upper electrode and the lower electrode. For example, optical scanning device 109 causes adjacent straight portions 1011a to flexurally vibrate in opposite directions by means of drivers 1012, thereby causing movable plate 102a to pivot about pivot axis 18. Furthermore, straight portion 1011a is provided with monitor 1013 disposed side by side with driver 1012. Monitor 1013 has the same structure as driver 1012. Monitor 1013 generates a waveform signal from the vibration occurring in straight portion 1011a. The generated waveform signal is used for the driving control of movable plate 102a. These drivers 1012 and monitors 1013 are respectively connected to electrode pads 14a in fixed portion 1010 through lines (not shown).

Optical element 101 has a plane structure formed by a MEMS (Micro Electro Mechanical Systems) process. For example, optical element 101 is formed by shaping a Si substrate using dry etching, forming a film using sputtering, forming a pattern using etching, and others.

As shown in FIG. 11, base 103 is provided with recess 103a for providing a space corresponding to a vibration area for vibration beam 1011 and movable plate 102a. Base 103 supports optical element 101 through fixed portion 1010 located in the circumferential portion of optical element 101. In other words, base 103 is connected to fixed portion 1010. In this way, base 103 has a suspension structure allowing the pivot motions of vibration beam 1011 and movable plate 102a.

Package 104 includes wall 105 that is tubular and open-ended at both ends, window 107 for closing one of openings 106, and bottom plate 108 for closing the other of openings 106. Optical element 101 and base 103 are housed in package 104. Wall 105 surrounds optical element 101 and base 103. Base 103 is supported by wall 105. Wall 105 is formed of ceramics or the like. Window 107 closes, among openings 106 of wall 105, opening 106a which is located in the optical paths of incoming light 1021 and outgoing light 1022. Window 107 is provided in the optical path and is transmissive to light. For example, window 107 is formed of optical glass. Wall 105 and window 107 are joined together by low-melting glass. Bottom plate 108 closes, among openings 106 of wall 105, opening 106b which is located opposite window 107. Bottom plate 108 is formed of a metal plate. Bottom plate 108 is combined with the edge face of wall 105 by seam welding. With such a structure, it is possible to enhance the airtightness of the package housing optical element 101 in optical scanning device 109.

An example of combining optical element 101 and base 103 together is described in detail.

Figure 13:
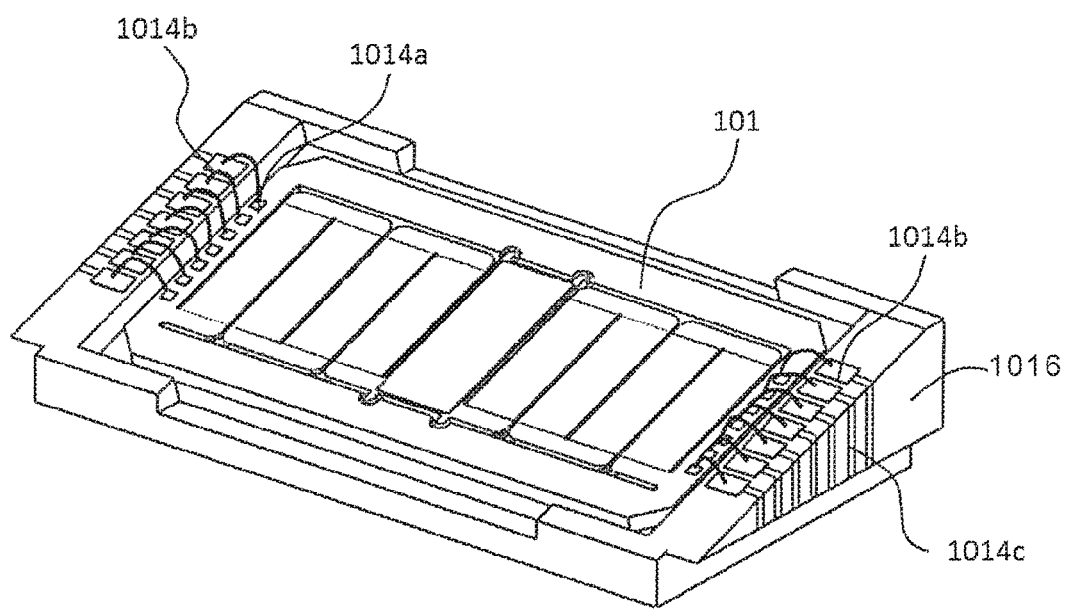
FIG. 13 is a schematic view of a combined structure of a base and the optical element in the optical device according to the present disclosure.

FIG. 13 illustrates a schematic view of a combined structure of optical element 101 and second base 1016.

First, optical element 101 is placed on second base 1016. Subsequently, electrode pad 1014a on optical element 101 and electrode pad 1014b on second base 1016 are interconnected by wire bonding. And an area of electrode pad 1014b is larger than an area of electrode pad 1014a. Wrapping electrode 1014c is connected to electrode pad 1014b. Wrapping electrode 1014c has a portion disposed on a top surface of second base 1016. Wrapping electrode 1014c has a portion disposed on a side surface of second base 1016. Wrapping electrode 1014c has a portion wrapping around the back of second base 1016. Next, first base 1015 is placed on second base 1016 such that optical element 101 is covered, and base 103 and optical element 101 are combined together as assembly. The combined assembly is inserted into wall 105 having window 107 bonded thereto as shown in FIG. 13.

Figure 14:
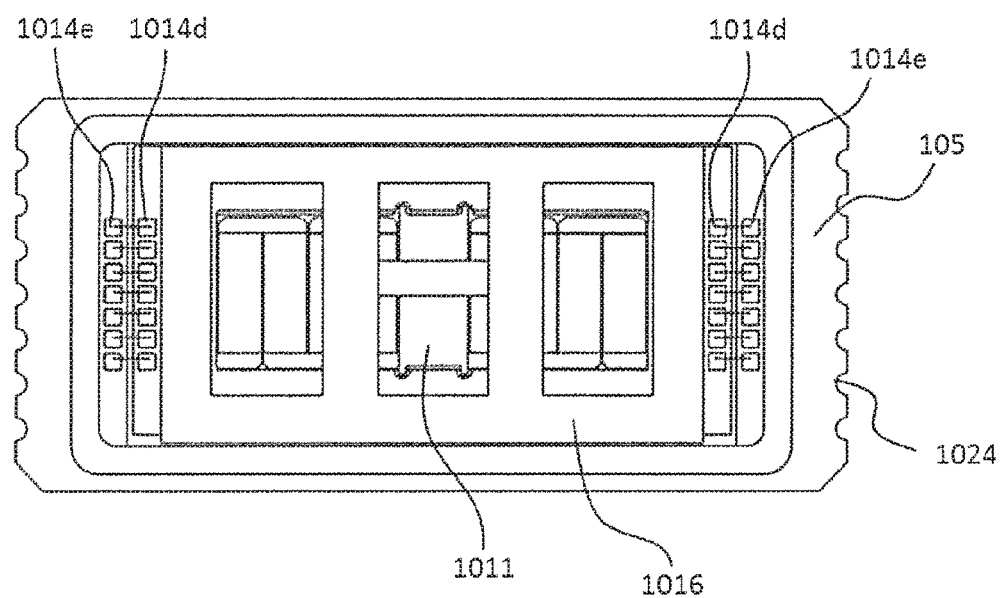
FIG. 14 is a schematic view of an arrangement in which the base according to the present disclosure is placed in a wall.
Figure 15:
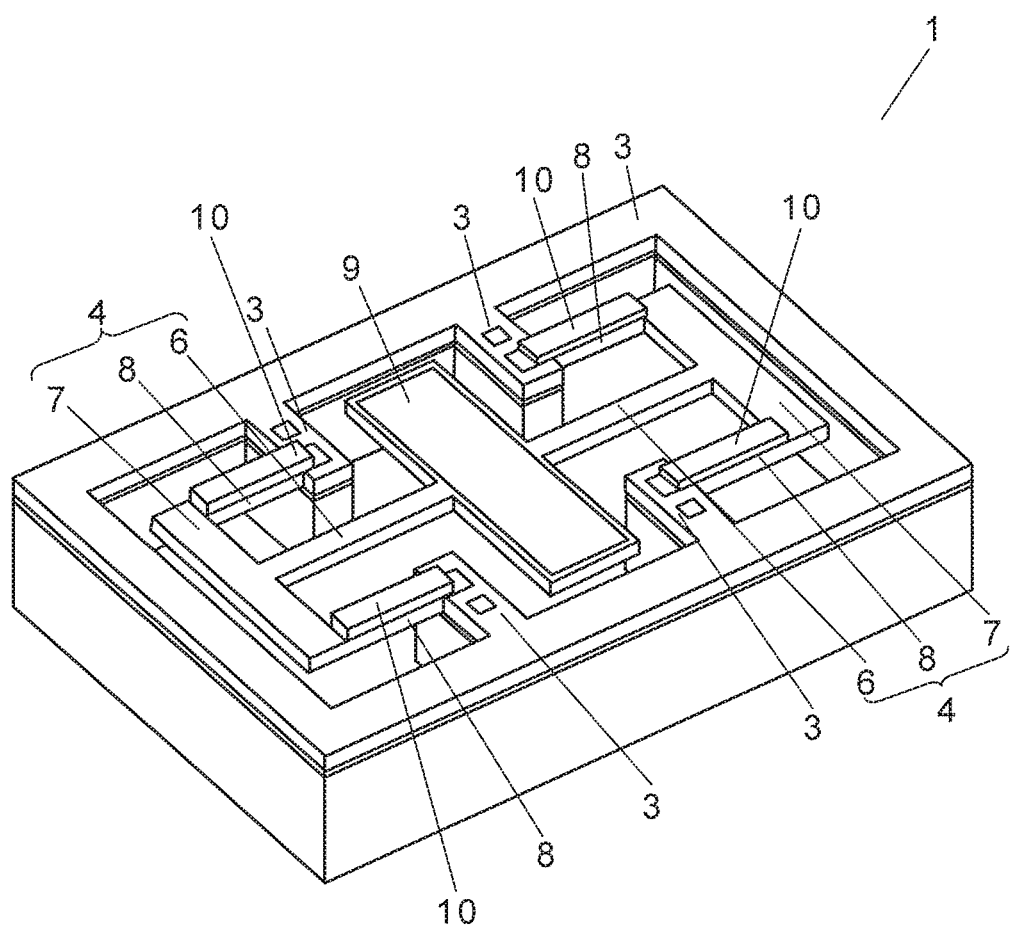
FIG. 15 is a perspective view of a conventional optical reflecting device.

FIG. 14 is a plan view of wall 105 having assembly inserted thereinto when viewed from opening 106b.

As shown in FIG. 14, in opening 106b of wall 105, electrode pad 1014d exposed to the backside is provided on second base 1016. Electrode pad 1014d is connected to electrode pad 1014b via wrapping electrode 1014e as shown in FIG. 13. Electrode pad 1014e is provided on the inner surface of wall 105. Electrode pad 1014d is connected to electrode pad 1014e by wire bonding. With such a structure, it is possible to form the control signal path without any complex process by interconnecting the electrode pads. It is to be noted that wall 105 has an inside electrode, but it is not shown. Electrode pad 1014e is connected to side electrode 1024 provided on the outer peripheral surface of wall 105 via the inside electrode. In this way, the control signal path connected to optical element 101 leads from wall 105 to optical element 101 via second base 1016.

Base 103 includes a structure divided into first base 1015 and second base 1016. Optical element 101 is provided between first base 1015 and second base 1016. Furthermore, optical element 101 is inclined relative to window 107 as shown in FIG. 11. In other words, optical element 101 and window 107 are non-parallel with each other. More specifically, the interface between base 103 and optical element 101 is not provided in parallel with the incident surface of window 107 for incoming light 1021. The interface between base 103 and optical element 101 is formed of dividing faces of base 103. The dividing faces of base 103 indicate an interface between first base 1015 and optical element 101, and an interface between second base 1016 and optical element 101. When optical element 101 and window 107 are parallel, the direction of surface-reflected light 1023 is almost the same as the direction of outgoing light 1022 from optical element 101. Accordingly, surface-reflected light 1023 appears as noise in a scanning area of outgoing light 1022 exiting via optical element 101. Accordingly, it is possible to prevent surface-reflected light 1023 from appearing as noise by providing optical element 101 inclined relative to window 107.

An optical reflecting device can project clear image on a screen, and can be used in a small-sized projector or a head-mounted display.

What is claimed is:
1. An optical element comprising:
a mirror part;
a plurality of beam parts connected to the mirror part;
a fixed part connected to the plurality of beam parts; and
a plurality of driving parts configured to rotate the mirror part around a first axis,
wherein the plurality of beam parts includes:
a first beam part and a second beam part each connected to the mirror part, and each extending along the first axis; and
a third beam part and a fourth beam part each connected to the first beam part and extending along a second axis orthogonal to the first axis,
wherein each of the third beam part and the fourth beam part is formed of a first curved part closer to the fixed part and a second curved part closer to the first beam part, and
wherein the curvature radius of the second curved part is different at a portion closer to the first curved part from at a portion closer to the first beam part.

2. The optical element according to claim 1, wherein a curvature radius of the first curved part is smaller than a curvature radius of the second curved part.

3. The optical element according to claim 1, wherein a curved direction of the first curved part is opposite to a curved direction of the second curved part.

4. The optical element according to claim 1, wherein each of the driving parts is formed on the second curved part.

5. The optical element according to claim 1 further comprising:
a fifth beam part and a sixth beam part each connected to the second beam portion and extending along the second axis, and having a portion extending along the first axis and connected to the fixed part.

6. The optical element according to claim 1, wherein each of the driving parts is formed by sequentially stacking a lower electrode film, a piezoelectric film, and an upper electrode film.

7. The optical element according to claim 1, wherein the fixed part configured to be fixed at an external frame which is separated from the optical element.

8. The optical element according to claim 1, wherein the optical element is one-axis driving device.

9. An optical element comprising:
a mirror part;
a plurality of beam parts connected to the mirror part;
a fixed part connected to the plurality of beam parts; and
a plurality of driving parts configured to rotate the mirror part around a first axis,
wherein the plurality of beam parts includes:
a first beam part and a second beam part each connected to the mirror part, and each extending along the first axis; and
a pair of beam parts connected to the first beam part and extending along a second axis orthogonal to the first axis,
wherein a curvature radius of a circumference at a connection portion between one of the pair of beam parts and the fixed part is smaller than a curvature radius of a circumference at a connection portion between the one of the pair of beam parts and the first beam part,
wherein each of the pair of beam parts is formed of a first curved part closer to the fixed part and a second curved part closer to the first beam part, and
wherein a curvature radius of the second curved part is different at a portion closer to the first curved part from at a portion closer to the first beam part.

10. The optical element according to claim 9, wherein a curved direction of the circumference at the connection portion between the one of the pair of beam parts and the fixed part is toward the mirror part, and a curved direction of the circumference at the connection portion between the one of the pair of beam parts and the first beam part is toward the fixed part.

11. The optical element according to claim 9, wherein a curvature radius of the first curved part is smaller than a curvature radius of the second curved part.

12. The optical element according to claim 11, wherein each of the driving parts is formed on the second curved part.

13. The optical element according to claim 9, wherein each of the driving parts is formed by sequentially stacking a lower electrode film, a piezoelectric film, and an upper electrode film.

14. An optical element comprising:
a mirror part;
a plurality of beam parts connected to the mirror part;
a fixed part connected to the plurality of beam parts; and
a plurality of driving parts configured to rotate the mirror part around a first axis,
wherein the plurality of beam parts includes:
   a first beam part and a second beam part each connected to the mirror part, and each extending along the first axis; and
   a third beam part and a fourth beam part each connected to the first beam part and extending along a second axis orthogonal to the first axis,
wherein each of the third beam part and the fourth beam part is formed of a first part closer to the fixed part and a second part closer to the first beam part,
wherein the first part and the second part are different curvature radius with each other, and
wherein the curvature radius of the second part is different at a portion closer to the first part from at a portion closer to the first beam part.

* * * * *